United States Patent
Blackham

(12) 
(10) Patent No.: US 6,396,285 B1
(45) Date of Patent: May 28, 2002

(54) METHOD AND APPARATUS FOR EFFICIENT MEASUREMENT OF RECIPROCAL MULTIPORT DEVICES IN VECTOR NETWORK ANALYSIS

(75) Inventor: David VerNon Blackham, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/638,278

(22) Filed: Aug. 14, 2000

(51) Int. Cl.[7] .......................... G01R 35/00; G01R 27/32
(52) U.S. Cl. ........................................ 324/601; 324/638
(58) Field of Search ................................ 324/601, 638, 324/76.19; 702/85

(56) References Cited

U.S. PATENT DOCUMENTS

| | | | |
|---|---|---|---|
| 5,578,932 A | * 11/1996 | Adamian | ..................... 324/601 |
| 5,748,000 A | 5/1998 | Blackham | |
| 6,060,888 A | * 5/2000 | Blackham et al. | .......... 324/601 |

* cited by examiner

Primary Examiner—N. Le
Assistant Examiner—James Kerveros

(57) ABSTRACT

Method and apparatus to determine scattering coefficients for a device under test (DUT) using a vector network analyzer (VNA) is disclosed. Traditionally, for a DUT having P ports, all combinations of reflective and transmission coefficients are measured and calculated. This is true even for reciprocal devices where $S_{ijA}=S_{jiA}$ because, during the measurement, the source and load matches vary. However, the present invention teaches that, for reciprocal devices, only one of the two transmission coefficients between a first port and a second port need be measured. Under the inventive technique, error terms are removed from the measured scattering coefficients. Then, the source and the load matches may be normalized to a normalization match value. The normalization process removes the differences of the source and the load matches. Accordingly, for reciprocal devices, only one of two reciprocal transmission coefficients need be measured to determine the transmission coefficients for both directions between the first and the second port. The reduction of the measurement requirement reduces the amount of hardware required for a VNA, time required to characterize a DUT, or both.

12 Claims, 2 Drawing Sheets

METHOD AND APPARATUS FOR EFFICIENT MEASUREMENT OF RECIPROCAL MULTIPORT DEVICES IN VECTOR NETWORK ANALYSIS

BACKGROUND

The present invention relates to vector network analyzers. More specifically, the present invention relates to the method and apparatus for efficiently measuring scattering parameters of multiport devices in vector network analysis.

Vector network analyzers (VNAs) are used to determine the transmission and reflection characteristics of various devices under test (DUTs). A transmission or a reflection characteristic is usually referred to as a scattering parameter S. In order to fully characterize a particular DUT, transmission characteristics and reflection characteristics for all combination of two ports are made. In general, for a P port device, this requires $P^2$ scattering parameters, or $S_{ij}$ for each i and j where i goes from 1 to P and j goes from 1 to P. A scattering coefficient is represented as $S_{ij}$ where $S_{ij}$ represents reflection coefficient for port i when i=j and transmission coefficient from port j to port i when i≠j. For convenience, additional subscript $_M$ is used to indicate a measured value, subscript $_C$ for partial error corrected value (corrected for isolation and tracking errors), subscript $_N$ for normalized value, and subscript $_A$ for actual value. For example, $S_{ijM}$ indicates measured transmission coefficient from port j to port i.

In order to fully characterize a device, the DUT, having P ports, the VNA performing the tests needs to either (1) have P or more receivers and make P sweeps of the DUT (hardware-intensive approach), or (2) have less than P receivers and make more than P sweeps (time-intensive approach). Here, a sweep may be defined as the process of sending out a source signal (the incident signal) from a given port and measuring detected signals from one or more ports which may include the source port. For example, to characterize a device, the DUT, having three ports (P=3), a VNA having 4 or more receivers, may make the sweeps listed in TABLE 1A. One receiver, Receiver 0, to measure the incident signal, and the other three (Receivers 1, 2, and 3) to measure the signal at each of the three ports. This would be the fastest approach but requires a VNA having the most hardware.

TABLE 1A

| Where P = 3 | Scattering parameter measured (Receiver 0 measure the incident signal) | | |
|---|---|---|---|
| | Receiver 1 | Receiver 2 | Receiver 3 |
| Sweep 1 | $S_{11}$ | $S_{21}$ | $S_{31}$ |
| Sweep 2 | $S_{12}$ | $S_{22}$ | $S_{32}$ |
| Sweep 3 | $S_{13}$ | $S_{23}$ | $S_{33}$ |

For any VNA, the minimum number of receivers needed is two—to first to the measure the incident signal and the other to measure the signal at a port. For a two-port VNA measuring a DUT having three ports, the sweeps listed in TABLE 1B are required. This would require the least amount of hardware within the VNA, but would be the slowest approach.

TABLE 1B

| Where P = 3 | Scattering parameter measured (Receiver 0 measure the incident signal) |
|---|---|
| | Receiver 1 |
| Sweep 1 | $S_{11}$ |
| Sweep 2 | $S_{12}$ |
| Sweep 3 | $S_{13}$ |
| Sweep 4 | $S_{21}$ |
| Sweep 5 | $S_{22}$ |
| Sweep 6 | $S_{23}$ |
| Sweep 7 | $S_{31}$ |
| Sweep 8 | $S_{32}$ |
| Sweep 9 | $S_{33}$ |

Alternatively, when using a VNA having 3 receivers, the VNA makes the sweeps listed in TABLE 2 to characterize a device having three ports.

TABLE 2

| Where P = 3 | Scattering parameter measured (Receiver 0 measure the incident signal) | |
|---|---|---|
| | Receiver 1 | Receiver 2 |
| Sweep 1 | $S_{11}$ | $S_{21}$ |
| Sweep 2 | $S_{11}$ | $S_{31}$ |
| Sweep 3 | $S_{22}$ | $S_{12}$ |
| Sweep 4 | $S_{22}$ | $S_{32}$ |
| Sweep 5 | $S_{33}$ | $S_{13}$ |
| Sweep 6 | $S_{33}$ | $S_{23}$ |

For practical implementation of VNAs, there is a trade-off between the hardware-intensive solution (higher cost) and the time-intensive solution (slower process). On the one hand, for the hardware-intensive approach, it is costly to build, operate, and maintain additional hardware required for the large number of receivers. On the other hand, as for the time-intensive approach, it takes longer period of time to fully characterize a device because multiple sweeps are made. Further, the number of required sweeps grows very fast as P, the number of ports of the device, grows. In fact, for a VNA having two receivers, the number of sweeps required to fully characterize a device is $P^2$.

There is a need for a technique and an apparatus to reduce the number of receivers, the number of sweeps, or both to fully characterize a device.

SUMMARY

These needs are met by the present invention. According to one embodiment of the present invention, a device under test (DUT) may be characterized by measuring transmission coefficient for transmission of signal from a first port to a second port, $S_{ijM}$. That measurement may be used to determine the actual transmission coefficient of transmission of signal from the second port to the first port, $S_{jiA}$, without having to measure the transmission coefficient of transmission of signal from the second port to the first port, $S_{jiM}$. Of course, the measured signal, $S_{ijM}$, may also be used to determine the actual transmission coefficient of transmission of signal from the first port to the second port According to another aspect of the invention, an apparatus for characterizing a device under test (DUT) is disclosed. The apparatus has a processor and storage connected to the processor. The storage holds instructions for the processor to measure transmission coefficient, $S_{jiM}$, for transmission of signal from a first port to a second port, and to determine, using that measurement, actual transmission coefficient, $S_{ijA}$, for transmission of signal from the second port to the first port.

Yet another aspect of the invention, a machine readable storage is disclosed. The storage is encoded with instructions causing, when executed by a machine, to measure transmission coefficient, $S_{jiM}$, for transmission of signal from a first port to a second port; and determine actual transmission coefficient, $S_{ijA}$, for transmission of signal from the second port to the first port.

Other aspects and advantages of the present invention will become apparent from the following detailed description, taken in conjunction with the accompanying drawings, illustrating by way of example, the principles of the present invention.

DETAILED DESCRIPTION

Figure 1:
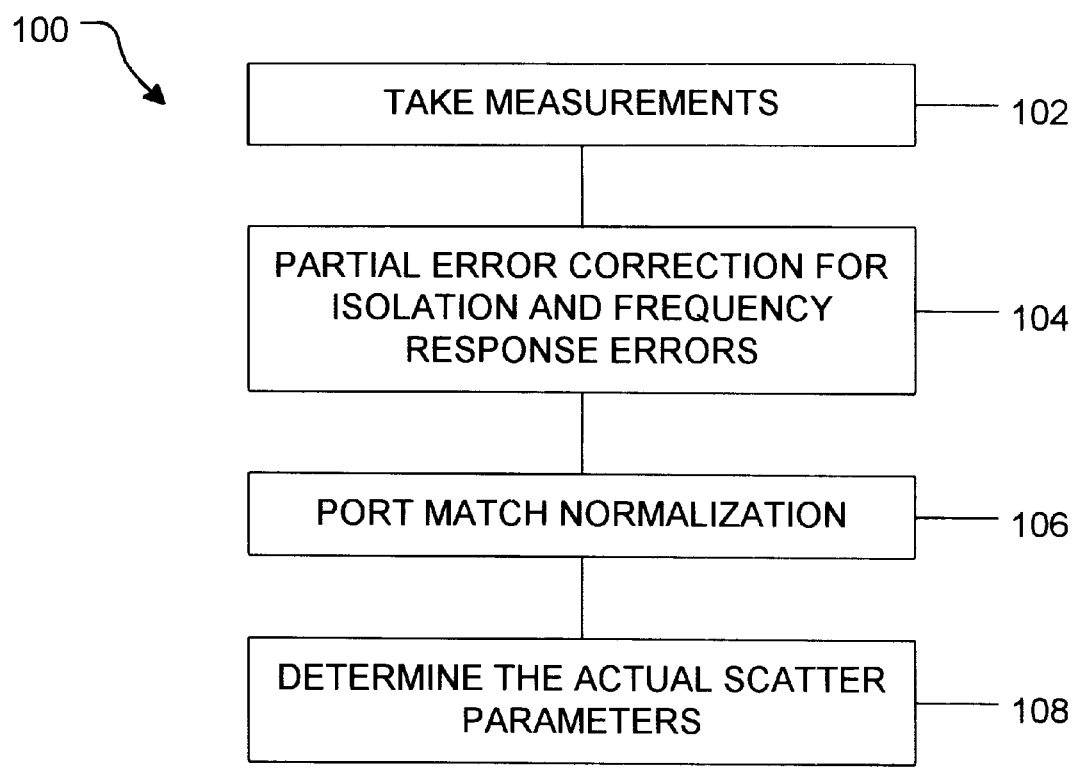
FIG. 1 illustrates a flowchart outlining the technique of the present invention.

As shown in the drawings for purposes of illustration, the present invention is embodied in a technique of measuring transmission coefficient, $S_{ijM}$, for transmission of signal from a first port to a second port. And, using that measurement to determine the actual coefficients $S_{jiA}$ as well as for $S_{ijA}$. This is applicable for reciprocal devices where $S_{ijA} = S_{jiA}$. For reciprocal devices, it is possible to reduce the number of transmission measurements required by a factor of two. This may be accomplished by using a single transmission measurement, $S_{ijM}$, to determine two scattering parameters, $S_{ijA}$ and $S_{jiA}$, thus reducing the number of measurements required to characterize a DUT. Accordingly, the number of receivers (hardware), the number of required sweeps (time), or some combination of both hardware and time is also reduced. For the reciprocal devices, although the actual coefficients $S_{ijA}$ and $S_{jiA}$ are equal, the measured coefficients $S_{ijM}$ and $S_{jiM}$ are not equal because match varies at each test port depending upon how the ports are switched as to source match, load match, and the actual VNA port used. However, using the technique of the present invention, $S_{ijM}$ may be normalized to represent both $S_{ijM}$ and $S_{jiM}$ and used in determining all of the DUT S-parameters.

Taking the Measurements

Referring to FIG. 1, a flowchart 100 outlining the technique of the present invention is illustrated. First, raw measurements are taken. Operation 102. To determine the transmission coefficient of any two ports i and j where i≠j, only one of the two transmission coefficients need be measured. That is, to fully error correct all S-parameters, only one measurement need be made between each pair of ports i and j—either $S_{ijM}$ or $S_{jiM}$. Using the example used for TABLE 2 above (for a three port DUT measured with a VNA having three receivers) only three sweeps are necessary to fully characterize the DUT. The three sweeps are listed in TABLE 3A. This is because once a measurement for a transmission coefficient from a first port to a second port, $S_{ijM}$, is taken, the measurement for a transmission coefficient from the second port to the first port, $S_{jiM}$, is not necessary.

TABLE 3A (CASE 1)

| | Scattering parameter measured | |
|---|---|---|
| Where P = 3 | Receiver 1 | Receiver 2 |
| Sweep 1 | $S_{11M}$ | $S_{21M}$ |
| Sweep 2 | $S_{22M}$ | $S_{32M}$ |
| Sweep 3 | $S_{33M}$ | $S_{13M}$ |

Alternative measurements that may be made are listed in TABLE 3B. The alternative measurements exist because, for any port combination i and j, either $S_{ij}$ or $S_{ji}$ may be measured.

TABLE 3B (CASE 2)

| | Scattering parameter measured | |
|---|---|---|
| Where P = 3 | Receiver 1 | Receiver 2 |
| Sweep 1 | $S_{11M}$ | $S_{31M}$ |
| Sweep 2 | $S_{22M}$ | $S_{12M}$ |
| Sweep 3 | $S_{33M}$ | $S_{23M}$ |

Error Correction

Next, the measured values are partially error corrected to remove isolation errors and frequency response errors introduced by a VNA. Operation 104. Imperfections in network analyzer hardware degrade measurement accuracy. The effect of some hardware imperfections can be characterized and removed from the measurements via vector error correction. Hardware imperfections corrected by this process include isolation errors (directivity for reflection measurements or crosstalk for transmission measurements), frequency response or tracking errors, and mismatch errors (due to source match or load match). These errors in multiport network analyzers can be characterized using methods established for two-port error correction. Once the errors are characterized they can be removed from the measurements. Here, the isolation error and frequency response errors are removed as follows:

$$S_{ijC} = (S_{ijM} - X_{ij})/T_{ij} \qquad \text{(Equation 1)}$$

where $S_{ijC}$ is the partial error corrected coefficient;

$S_{ijM}$ is the raw, measured coefficient, $X_{ij}$ is isolation error;

$T_{ij}$ is frequency response error; and where i goes from 1 to P and j goes from 1 to P where P is the number of ports for the DUT.

Techniques to obtain actual values for the isolation error and the frequency response error for any port combination i and j are known in the art. For example, TABLE 4 lists a mapping between the characterized error terms from three two-port calibrations to a three-port error correction. This may be used for the three-port VNA illustrated in FIG. 2. For other VNA configurations, the correlations and error correction values may vary as known in the art.

TABLE 4

| Calibration between ports 1 and 2 | Calibration between ports 1 and 3 | Calibration between ports 2 and 3 |
| --- | --- | --- |
| Forward Directivity Error ($E_{DF}$) = $X_{1,1}$ | $E_{DF} = X_{1,1}$ | $E_{DF} = X_{2,2}$ (PORT 3) |
| Forward Source Match Error ($E_{SF}$) = $G_{1S}$ | $E_{SF} = G_{1S}$ | $E_{SF} = G_{2S}$ (PORT 3) |
| Forward Reference Tracking Error ($E_{RF}$) = $T_{1,1}$ | $E_{RF} = T_{1,1}$ | $E_{RF} = T_{2,2}$ (PORT 3) |
| Forward Crosstalk Error ($E_{XF}$) = $X_{2,1}$ | $E_{XF} = X_{3,1}$ | $E_{XF} = X_{3,2}$ |
| Forward Load Match Error ($E_{LF}$) = $G_{2L}$ | $E_{LF} = G_{3L}$ (VIA SWITCH S0) | $E_{LF} = G_{3L}$ (VIA SWITCH S1) |
| Forward Tracking Error ($E_{TF}$) = $T_{2,1}$ | $E_{TF} = T_{3,1}$ | $E_{TF} = T_{3,2}$ |
| Reverse Directivity Error ($E_{DR}$) = $X_{2,2(VIA\ PORT\ 1)}$ | $E_{DR} = X_{3,3}$ | $E_{DR} = X_{3,3}$ |
| Reverse Source Match Error ($E_{SR}$) = $G_{2S\ (PORT\ 1)}$ | $E_{SR} = G_{3S}$ | $E_{SR} = G_{3S}$ |
| Reverse Reference Tracking Error ($E_{RR}$) = $T_{2,2\ (PORT\ 1)}$ | $E_{RR} = T_{3,3}$ | $E_{RR} = T_{3,3}$ |
| Reverse Crosstalk Error ($E_{XR}$) = $X_{1,2}$ | $E_{XR} = X_{1,3}$ | $E_{XR} = X_{2,3}$ |
| Reverse Load Match Error ($E_{LR}$) = $G_{1L}$ | $E_{LR} = G_{1L}$ | $E_{LR} = G_{2L}$ |
| Reverse Tracking Error ($E_{TF}$) = $T_{1,2}$ | $E_{TF} = T_{1,3}$ | $E_{TF} = T_{2,3}$ |

Normalization

Then, the partial error corrected coefficients are match normalized. Operation 106. The normalization modifies effective mismatch at each port to simulate a condition of having a constant mismatch at each port rather than the actual case where the mismatch at each port varies depending upon the S-parameter being measured. The effective port match at any port can be modified by mathematically adding a normalization match term $$(G_{Nk}-G_{Uk})$$

where $G_{Nk}$ is a desired normalized match at port k; and $G_{Uk}$ is the current match at port k.

The description of measured S parameters as a function of actual S parameters and residual errors are established using the Mason's Rule. See Samuel J. Mason, "Feedback Theory—Further Properties of Signal Flow Graphs," Proceedings of the IRE, vol. 44, no. 7, p. 920–926, Jul. 1956 (hereinafter the "Mason article"). The Mason article is incorporated here by reference. The Mason's rule also establishes the relationship between the normalized S parameters as a function of the partially corrected S parameters and the normalization match terms.

The normalization technique of adding the normalization match term ($G_{Nk}-G_{Uk}$, is applicable for DUTs having any number of ports. For the purposes of discussing the present invention, the normalization technique of the present invention is explained herein for a DUT having three ports characterized by a sample VNA 110 of FIG. 2. The sample VNA and techniques as illustrated by the equations herein below are used herein to illustrate the present invention.

Figure 2:
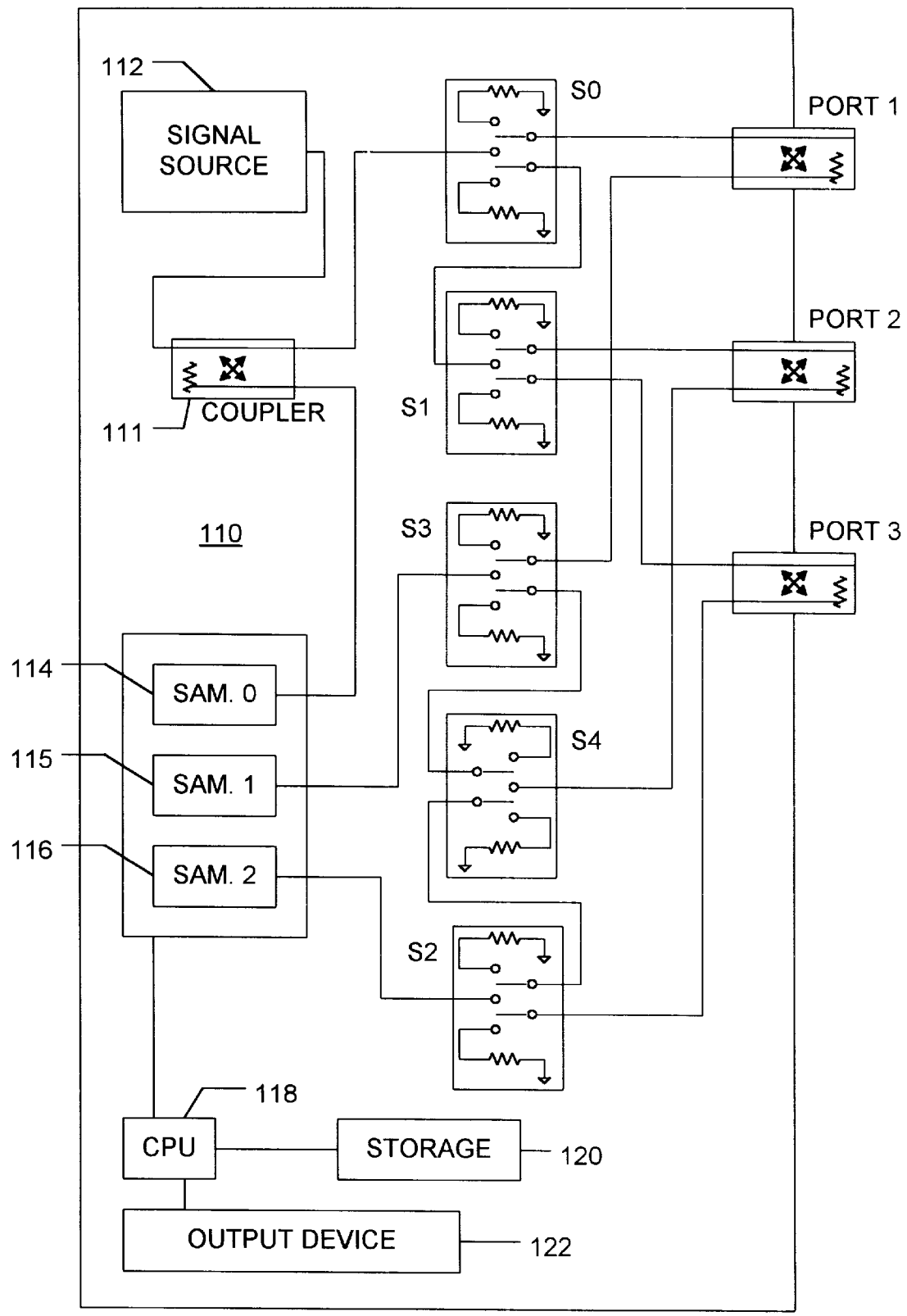
FIG. 2 illustrates a device according to one embodiment of the present invention.

Referring to FIG. 2, the VNA 110 has a signal source 112, a coupler 111 and three ports—Port 1, Port 2, and Port 3. The signal source 112 supplies source signal to any of the three ports via switch S0 or a combination of S0 and S1. The source signal goes through the coupler 111 to be sampled by a first receiver 114. Signals received by any of the three ports may be detected by a second receiver 115 or a third receiver 116 via switches S2, S3, S4, or a combination of these switches.

Note that each switch has resistors as terminating load paths for the paths not being used as to send or receive signals. When a path is not selected, it is terminated into internal resistors nominally equal to system characteristic impedance. In general, because each port may terminate into different resistors, the match terms will vary depending upon which resistor the line is terminating into.

Then, the normalization process requires the determination of the following equations. The normalized coefficients $S_{ijN}$ are determined as follows:

$$S_{ijN}=S_{ijC}/[1-S_{ijC}(G_{jL}-G_{jS})]$$ (Equation 2)

where $S_{ijN}$ is the normalized coefficient;

$S_{ijC}$ is the partial error corrected coefficient;

$G_{jL}$ is load match at port j;

$G_{jS}$ is source match at port j; and where i goes from 1 to P and j goes from 1 to P where P is the number of ports for the DUT.

For the sample DUT having three ports being measured using the sample VNA 110, the Equation 2 ("Eq. 2") is applicable for determining the normalized scattering coefficients having ports 2 or 3 as the source port, namely $S_{12N}$, $S_{22N}$, $S_{32N}$, $S_{13N}$, $S_{23N}$, and $S_{33N}$. As for normalized scattering coefficients having port 1 as the source port, the normalized coefficients $S_{i1N}$ are determined as follows:

$$S_{i1N}=[S_{i1C}+(S_{i3N}S_{31C}[G_{3L(S1)}-G_{3L(S0)}])]/[1-S_{11C}(G_{1L}-G_{1S})]$$ (Eq. 3)

where $S_{i1N}$ is the normalized coefficient having source at port 1;

$S_{i1C}$ is the partial error corrected coefficient having source at port 1;

$G_{3L(S1)}$ is load match at port 3 when terminated into Switch S1;

$G_{3L(S0)}$ is load match at port 3 when terminated into Switch S0; and where i goes from 1 to P where P is the number of ports for the DUT.

For normalized scattering coefficients having port 1 as a the source port, Eq. 3 is required because normalizations are required for both ports one and three. This is because port three may be terminated into switch S0 or switch S1. For the illustrated sample VNA of FIG. 2, TABLE 5A is the switching matrix lists all the switching options. For reflection measurements, the port connected to the other receiver is noted in parenthesis in TABLE 5A.

TABLE 5A

| Source at Port 1 | Source at Port 2 | Source at Port 3 |
| --- | --- | --- |
| $S_{11(2)}$; Port 2 in S1, Port 3 in S0 $S_{11(3)}$; Port 2 in S1, Port 3 in S0 | $S_{12}$; Port 1 in S0, Port 3 in S1 | $S_{13}$; Port 1 in S0, Port 2 in S1 |
| $S_{21}$; Port 2 in S1, Port 3 in S0 | $S_{22(1)}$; Port 1 in S0, Port 3 in S1 $S_{22(3)}$; Port 1 in S0, Port 3 in S1 | $S_{23}$; Port 1 in S0, Port 2 in S1 |
| $S_{31}$; port 2 in S1, Port 3 in S0 | $S_{32}$; Port 1 in S0, Port 3 in S1 | $S_{33(1)}$; Port 1 in S0, Port 2 in S1 $S_{33(2)}$; Port 1 in S0, Port 2 in S1 |

Equation 3 above is applicable for all devices. For reciprocal devices, not all transmission coefficients are required to be measured. Therefore, not all of the measured coefficients are available for application by the equations Eq. 2 and Eq. 3. This is because only one of reciprocal pairs, $S_{ij}$ and $S_{ji}$, is measured. Thus, depending on which of the reciprocal pairs are measured, and in the present example, also depending on which switch is used for the measurement, the match terms are taken into account. Reviewing two sample cases, TABLES 3A and 3B may be combined as

TABLE 5B

|  | Scattering parameters measured (CASE 1) | | Scattering parameter measured (CASE 2) | |
| --- | --- | --- | --- | --- |
|  | Receiver 1 | Receiver 2 | Receiver 1 | Receiver 2 |
| Sweep 1 | $S_{11M}$ | $S_{21M}$ | $S_{11M}$ | $S_{31M}$ |
| Sweep 2 | $S_{22M}$ | $S_{32M}$ | $S_{22M}$ | $S_{12M}$ |
| Sweep 3 | $S_{33M}$ | $S_{13M}$ | $S_{33M}$ | $S_{23M}$ |

For CASE 1, normalization equation Eq. 3 is applicable except for $S_{11}$ and $S_{21}$. These are as follows:

$$S_{11N}=[S_{11C}/(1-S_{11C}[G_{1L}-G_{1S}])]+[([S_{13N}]^2[G_{3L)S1})G_{3L(S0)}])/(1+S_{33N}[G_{3L(S1)}-G_{3L(S0)}])] \quad \text{(Eq. 4)}$$

and $$S_{21N}=[S_{21C}/(1-S_{11C}[G_{1L}-G_{1S}])]+[(S_{32N}S_{13N}[G_{3L(S1)}-G_{3L(S0)}])/(1+S_{33N}[G_{3L(S1)}-G_{3L(S0)}])] \quad \text{(Eq. 5)}$$

where $S_{11N}$ is the normalized reflection coefficient for port 1;

$S_{11C}$ is the partial error corrected reflection coefficient for port 1;

$G_{1L}$ is load match at port 1;

$G_{1S}$ is source match at port 1;

$S_{13N}$ is the normalized transmission coefficient from port 3 to port 1;

$S_{33N}$ is the normalized reflection coefficient for port 3;

$G_{3L(S1)}$ is load match at port 3 when terminated at switch S1;

$G_{3L(S0)}$ is load match at port 3 when terminated at switch S0;

$S_{21N}$ is the normalized transmission coefficient from port 1 to port 2;

$S_{21C}$ is the partial error corrected transmission coefficient from port 1 to port 2; and $S_{32N}$ is the normalized transmission coefficient from port 2 to port 3.

Using the values gained from equations Eq. 2, 3, 4, and 5, the following matrix $S_{N-1}$ of normalized scattering coefficients may be formed in Case 1:

$$S_{NCase1} = \begin{bmatrix} S_{11N} & S_{21N} & S_{13N} \\ S_{21N} & S_{22N} & S_{32N} \\ S_{13N} & S_{32N} & S_{33N} \end{bmatrix}$$

For CASE 2, normalization equation Eq. 3 is applicable except for $S_{11}$ and $S_{21}$. These are as follows:

$$S_{11N}[S_{11C}/(1-S_{11C}[G_{1L}-G_{1S}])]+[([S_{31C}]^2[G_{3L(S1)}-G_{3L(S0)}][1+S_{33N}(G_{3L(S1)}-G_{3L(S0)})])/(1-S_{11C}[G_{1L}-G_{1S}])^2] \quad \text{(Eq. 6)}$$

and $$S_{31N}=[S_{31C}(1+S_{33N}[G_{3L(S1)}-G_{3L(S0)}])]/[1-S_{11C}(G_{1L}-G_{1S})] \quad \text{(Eq. 7)}$$

where $S_{11N}$ is the normalized reflection coefficient for port 1;

$S_{11C}$ is the partial error corrected reflection coefficient for port 1;

$G_{1L}$ is load match at port 1;

$G_{1S}$ is source match at port 1;

$S_{31C}$ is the partial error corrected transmission coefficient from port 1 to port 3;

$S_{31N}$ is the normalized transmission coefficient from port 1 to port 3;

$S_{31N}$ is the normalized transmission coefficient from port 1 to port 3;

$S_{33N}$ is the normalized reflection coefficient for port 3;

$G_{3L(S1)}$ is load match at port 3 when terminated at switch S1;

$G_{3L(S0)}$ is load match at port 3 when terminated at switch S0;

$S_{21N}$ is the normalized transmission coefficient from port 1 to port 2;

$S_{21C}$ is the partial error corrected transmission coefficient from port 1 to port 2; and $S_{23N}$ is the normalized transmission coefficient from port 3 to port 2.

Using the values gained from equations Eq. 2, 3, 6, and 7, the following matrix $S_{N-2}$ of normalized scattering coefficients may be formed in Case 2:

$$S_{NCase2} = \begin{bmatrix} S_{11N} & S_{12N} & S_{31N} \\ S_{12N} & S_{22N} & S_{23N} \\ S_{31N} & S_{23N} & S_{33N} \end{bmatrix}$$

Using the normalized scattering coefficient matrix, the actual scattering coefficients may be determined as $$S_A = S_N(I+G\ S_N)^{-1} \quad \text{(Eq. 8)}$$

where $S_A$ is a matrix of the actual scattering coefficients $$\begin{bmatrix} S_{11A} & S_{12A} & S_{13A} \\ S_{21A} & S_{22A} & S_{23A} \\ S_{31A} & S_{32A} & S_{33A} \end{bmatrix};$$

$S_N$ is either $S_{NCase1}$ or $S_{NCase2}$ as described above for the sample VNA of FIG. 2, or, in general, a normalization matrix formed using Equations 2 and 3; is the identity matrix $$\begin{bmatrix} 1 & 0 & 0 \\ 0 & 1 & 0 \\ 0 & 0 & 1 \end{bmatrix};$$

and

G is a normalized match matrix $$\begin{bmatrix} G_{N1} & 0 & 0 \\ 0 & G_{N2} & 0 \\ 0 & 0 & G_{N3} \end{bmatrix}.$$

Equation Eq. 8 shows that even for reciprocal devices, $S_{ijM}$ cannot be merely substituted as $S_{ijM}$ to find $S_{ijA}$ and $S_{jiA}$. Rather, each S parameter is influenced by all the other S parameters. The normalization step allows the use of $S_{ijM}$ to find both $S_{ijA}$ and $S_{jiA}$ thus take advantage of the reciprocity of the device under test.

Continuing to refer to FIG. 2, the VNA 110 may also include a processor 118 connected to the receivers 114, 115, and 116 for reading the measured scattered values. The processor is preferably connected to storage 120. Preferably the storage 120 is a programmable read only memory (PROM); however, the storage 120 may be any suitable machine readable device including, without limitation, random access memory (RAM), magnetic drive (a harddrive device), optical drive (CD-ROM), or a combination of these. The storage 120 may be encoded with instructions that, when executed by the processor 118, cause the processor 118 to measure S-parameter $S_{ijM}$, for of signal from a first port to a second port, and to determine actual coefficient, $S_{ijA}$ from the second port to the first port. The first port may be the same or may be different from the second port. Preferably, the instructions implement the technique and the processes discussed herein above. The processor 120 may also be connected to an output device 122 to display the scattering coefficients.

From the foregoing it will be appreciated that the DUT characterization technique and apparatus of the present invention reduces hardware requirements for a VNA, reduces characterization time, or both. Although specific embodiments of the present invention have been described and illustrated, the invention is not to be limited to the specific forms or arrangements of parts so described and illustrated. For example, the DUT may have many ports, or the VNA may include any number of receiver circuits. Moreover, the technique, including without limitation the equations, as illustrated herein above may be modified for application for VNAs having varying number of receiver circuits. The invention is limited only by the claims.

What is claimed is:

1. A method of characterizing a device under test (DUT) using a vector network analyzer, the method comprising:
measuring transmission coefficient, $S_{ijM}$, for transmission of signal from a first port to a second port; and
determining actual transmission coefficient, $S_{jiA}$, for transmission of signal from the second port to the first port using the measured transmission coefficient $S_{ijM}$ without having to measure transmission coefficient, $S_{jiM}$, for transmission of signal from the second port to the first port.

2. The method recited in claim 1 wherein the actual transmission coefficient, $S_{jiA}$, is determined by:
partially error correcting the measured transmission coefficient $S_{ijM}$ resulting in a partial error corrected coefficient $S_{ijC}$;
applying port match normalization to the partial error corrected coefficient $S_{ijC}$; and
determining actual transmission coefficient, $S_{jiA}$, for transmission of signal from the first port to the second port.

3. The method recited in claim 2 wherein the measured transmission coefficient $S_{ijM}$ is partially error corrected by subtracting a characterized isolation term, then dividing by a characterized frequency response term.

4. The method recited in claim 2 wherein the partial corrected coefficient is normalized by application of a match term $(G_N - G_U)$ to each port where $G_N$ is a desired normalized match and $G_U$ is a current match.

5. The method recited in claim 2 wherein the actual scattering coefficients are determined by applying equation $$S_A = S_N (I + G\, S_N)^{-1}$$

where $S_A$ is a matrix of actual scattering coefficients;

$S_N$ is a matrix of normalized scattering coefficients;

I is the identity matrix; and

G is a normalized match matrix.

6. An apparatus for characterizing a device under test (DUT), the apparatus comprising:
a processor;
storage connected to said processor, said storage including instructions for said processor to
measure transmission coefficient, $S_{jiM}$, for transmission of signal from a first port to a second port; and
determine actual transmission coefficient, $S_{ijA}$, for transmission of signal from the second port to the first port.

7. The apparatus recited in claim 6 further comprising:
signal source for generating test signal;
ports connected to the signal source for transmitting and receiving the generated signal; and
receivers for sampling the received signal.

8. An article of manufacture comprising:
machine readable storage; and
instructions encoded on the storage, the instructions causing a machine to
measure transmission coefficient, $S_{jiM}$, for transmission of signal from a first port to a second port; and
determine actual transmission coefficient, $S_{ijA}$, for transmission of signal from the second port to the first port.

9. The article recited in claim 8 further comprising instructions for the machine to determine transmission coefficient, $S_{jiA}$, the instructions causing the machine to:
partially error correct the measured transmission coefficient $S_{ijM}$ resulting in a partial error corrected coefficient $S_{ijC}$;
apply port match normalization to the partial error corrected coefficient $S_{ijC}$; and
determine actual transmission coefficient, $S_{jiA}$, for transmission of signal from the first port to the second port.

10. The article recited in claim 9 wherein the measured transmission coefficient $S_{ijM}$ is partially error corrected by subtracting a characterized isolation term, then dividing by a characterized frequency response term.

11. The article recited in claim 9 wherein the partial corrected coefficient is normalized by application of a match term $(G_N-G_U)$ to each port where $G_N$ is a desired normalized match and $G_U$ is a current match.

12. The article recited in claim 9 wherein the actual scattering coefficients are determined by applying equation $$S_A = S_N(I+G\ S_N)^{-1}$$

where $S_A$ is a matrix of actual scattering coefficients;

$S_N$ is a matrix of normalized scattering coefficients;

I is the identity matrix; and

G is a normalized match matrix.

* * * * *